(12) United States Patent
Devnani et al.

(10) Patent No.: US 7,227,254 B2
(45) Date of Patent: Jun. 5, 2007

(54) INTEGRATED CIRCUIT PACKAGE

(75) Inventors: Nurwati S Devnani, Fort Collins, CO (US); James Oliver Barnes, Ft Collins, CO (US); Charles E Moore, Loveland, CO (US); Benny W H Lai, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/114,625

(22) Filed: Apr. 2, 2002

(65) Prior Publication Data

US 2003/0183919 A1 Oct. 2, 2003

(51) Int. Cl.
*H01L 21/302* (2006.01)

(52) U.S. Cl. .................. 257/691; 257/690; 257/208; 257/210; 257/503; 257/781; 257/782; 257/773; 257/784; 257/786; 257/648; 438/618; 438/666

(58) Field of Classification Search ............... 257/690, 257/691, 208, 210, 503, 781, 782, 773, 784, 257/786, 698; 438/618, 666
See application file for complete search history.

(56) References Cited

PUBLICATIONS

David M. Pozar, Microwave Engineering, Power Dividers and Directional Coupler, Chapter 7 (1998).

*Primary Examiner*—Tom Thomas
*Assistant Examiner*—Junghwa Im

(57) ABSTRACT

A packaged IC includes an IC die with signal and signal complement traces positioned relative to each other to maximize broadside coupling for a matching impedance. The signal and signal complement traces are electrically connected to transmission or receive channels of the IC die. Use of a broadside coupled trace configuration alleviates routing congestion in an IC package and permits an IC to accommodate a greater number of channels within a given surface area than is possible under the prior art.

19 Claims, 12 Drawing Sheets

INTEGRATED CIRCUIT PACKAGE

BACKGROUND

Designing electronics for reliable high speed signal transmission requires attention be paid to signal trace quality, trace geometries, and impedance matching. This is true for both printed circuit boards as well as integrated circuit ("IC") packages attached to the printed circuit board ("PCB"). An example of a high speed IC is a Serdes IC, which is a contraction for serialization-deserialization integrated circuit. A Serdes IC typically has multiple transmission and receive channels. In order to minimize noise, common mode voltages, and other non-optimum signal characteristics affecting system performance, the Serdes design uses a differential pair for each transmission and receive channel. The Serdes IC package, therefore, must accommodate at least as many differential pair traces as there are channels and route those channels to leads of the IC where they can be implemented as part of a larger system.

A conventional configuration of high-speed signal traces for differential pairs on an IC package or a PCB comprises an edge-side coupled, configuration in which traces are positioned co-planar and parallel to each other. A typical laminate IC package or PCB has a dielectric constant of approximately 4. This permits relatively close spacing of differential signal pairs in the edge-side coupled configuration. A ceramic IC package is less expensive and has a lower dielectric loss than laminate. Therefore, there are significant benefits to using a ceramic IC package, which has a dielectric constant of between 9.8 and 10. In order to achieve a conventional 50 ohm trace impedance, a ceramic IC package dictates that the differential signal traces have an edge to edge spacing of 300 microns which is wide as compared to the spacing requirements on laminate. Additionally, an edge-side coupled configuration requires a single electrically conductive reference plane. The edge-side coupled differential pairs are positioned on a single layer. An edge-side coupled configuration, therefore, promotes an IC with a large surface area in order to accommodate access to signals on the IC die at a location where they are launched onto the IC package. In other words, the edge-side coupled configuration requires a significant amount of space to properly route the traces to electrically connect all of the transmit and receive channels to the IC package. As one of ordinary skill in the art appreciates, such a large spacing requirement impacts the routing density for a given IC of a given size and greatly increases the cost of the IC.

As electrical systems get smaller, it is desirable to increase the number of channels on an IC die. In an edge-side coupled configuration, in order to increase the number of channels on the IC, an IC die edge must be lengthened to accommodate the additional channels and spacing requirement. In many cases, it is possible to lay out an IC design, so that IC circuitry is positioned in the spaces that might be used for package routing. In a Serdes IC, however, relatively little of the surface area of the IC is used for circuitry. Most of the circuitry is concentrated at one or more channel pads adjacent to the IC die edge. As an example, a transmit signal, a transmit signal complement, a reference potential, and a transmit bias potential are each positioned on a single signal pad unit on the IC. In order to minimize IC area, the four constituent electrical signals may be aligned from the IC die edge towards a center of the IC die. Another channel is similarly aligned and positioned adjacent the first channel pad. The channel-to-channel physical spacing is defined by the amount of space required to route the signal lines while maintaining the appropriate trace impedance. In a conventional edge-side coupled trace configuration in a ceramic package, there should be 300 micron spacing between the signal and signal complement traces. Add this to the amount of space required for channel-to-channel spacing and there is a significant amount of spaces required for trace layout. As the number of channels increase, so does the perimeter of the IC. Under the prior art, incremental increases in the perimeter of the IC die to accommodate an increase in the number of channels causes the surface area of the IC die to increase at a faster rate. The cost of an IC is directly related to the surface area. Under the prior art, therefore, the cost per channel of a Serdes IC increases with an increase in the number of channels on the IC die.

Accordingly, there is a need to maintain the surface area of a Serdes IC while increasing the number of channels the IC can accommodate.

SUMMARY

According to an aspect of the present invention, a packaged IC comprises an IC die, a signal trace and a signal complement trace. The signal and signal complement traces are positioned relative to each other to maximize broadside coupling for a matching impedance, and are separated from each other by a dielectric coupling layer. The signal and signal complement traces are electrically connected to pads on the IC die. A signal trace conductive reference plane is separated from the signal trace by a signal trace dielectric isolation layer, and a signal complement trace conductive reference plane is separated from the signal complement trace by a signal complement trace dielectric isolation layer. According to another aspect of the present invention, a method of manufacturing a packaged IC comprises the steps of calculating trace width and spacing requirements of one or more signal and signal complement traces for a matching impedance at a given dielectric constant using broadside coupling in an IC package design, and positioning the one or more signal and signal complement traces to maximize broadside coupling according to the step of calculating in an IC package design. The method also has the step of positioning one or more signal and signal complement trace conductive reference planes parallel to the signal and signal complement traces which are separated by signal and signal complement trace dielectric isolation layers in the IC package design. Manufacturing an IC package according to the IC package design, and electrically connecting pads on an IC die to the signal and signal complement traces of the IC package.

According to yet another aspect of the present invention, an IC die comprises a plurality of first signal and signal complement die pad pairs, each first signal and signal complement die pad pair aligned along parallel lines that are perpendicular to a die edge, the plurality of first signal and signal complement die pad pairs being adjacent the die edge. A plurality of second signal and signal complement die pads are aligned along the parallel lines that are perpendicular to the die edge. The plurality of second signal and signal complement die pads being on an opposite side of the plurality of first signal and signal complement pads from the die edge.

A packaged IC according to the teachings of the present invention advantageously alleviates routing congestion and permits placement of input and output channels on an interior portion of the IC die. Additionally, the packaged IC is able to further decrease both surface area and trace density by stacking routing layers vertically.

DETAILED DESCRIPTION

Figure 1:
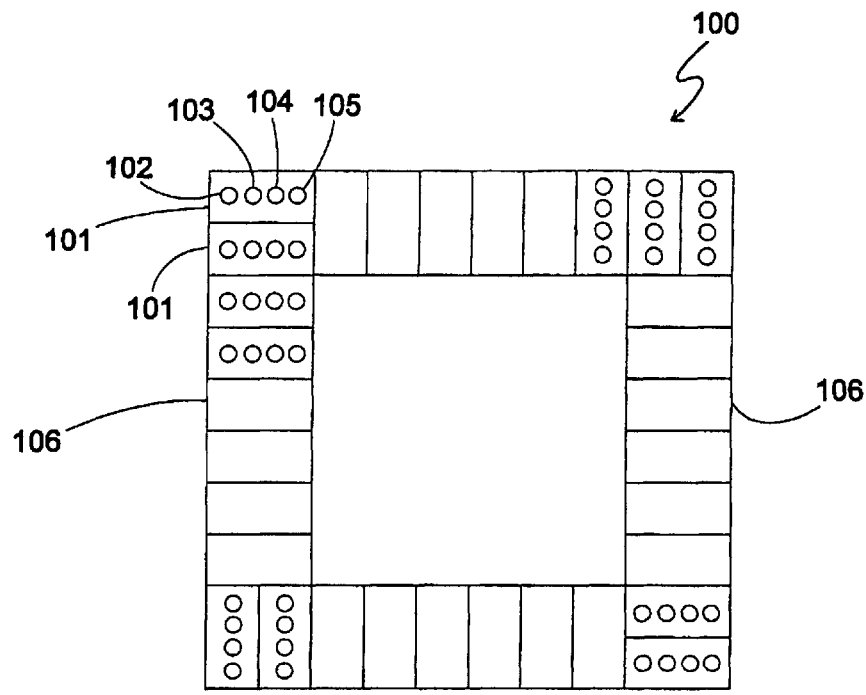
FIG. 1 is a plan view representation of an IC die showing interconnection bumps on its surface.

With specific reference to FIG. 1 of the drawings, there is shown a plan view representation of an IC die 100 having along its IC die edge 106 interconnection bump units 101, one bump unit for each transmission or receive. Each interconnection bump unit 101 comprises four bumps that are electrical connections to signals intended for distribution to or from and IC package and eventually a PCB. The interconnection bumps are created with a process that is conventional in the prior art. Each interconnection bump unit 101 comprises a signal bump 102, signal complement bump 103, a reference potential bump 104, and a bias potential bump 105. As discussed more fully herein, each signal bump unit 101 may have a different order in which the constituent bumps 102–105 are positioned. Each bump in the bump unit 101 has a corresponding flip-chip pad on an IC package that is designed to accept and accommodate the IC die 100.

Figure 2:
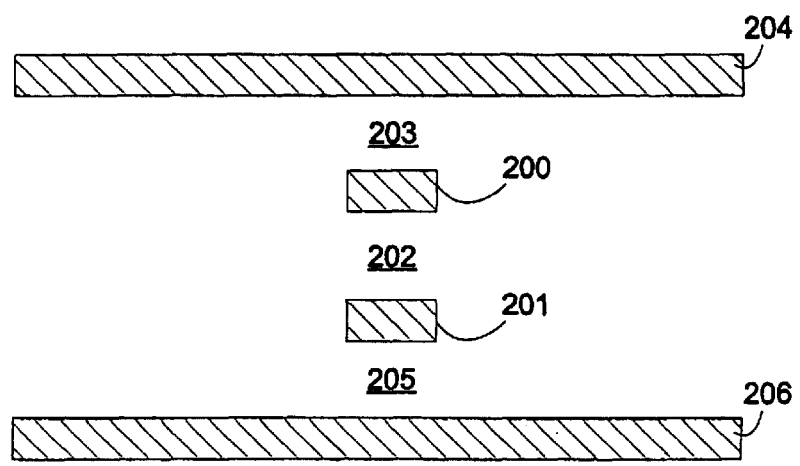
FIG. 2 is a cross sectional representation in a plane perpendicular to signal and signal complement traces in an IC package according to the teachings of the present invention.

With specific reference to FIG. 2 of the drawings, there is shown a cross sectional representation of a signal trace 200 and signal complement trace 201 for an IC package designed to accommodate the IC bump units 101 shown in FIG. 1. The signal and signal complement traces 200, 201 carry constituent signals of a differential signal pair. FIG. 2 shows a signal and signal complement trace 200, 201 in a broadside coupled configuration, where the traces are parallel, but are not co-planar. The signal and signal complement traces 200, 201 are separated from each other by a dielectric coupling layer 202 made of ceramic. A signal trace dielectric isolation layer 203 separates the signal trace 200 from a signal trace conductive reference layer 204. For proper electrical balance, a signal complement trace dielectric isolation layer 205 separates the signal complement trace 201 from a signal complement conductive reference layer 206. The elements 200 through 206 together comprise a single broadside coupled trace layer for a differential signal. The specific embodiment discussed herein uses an alumina ceramic package where alumina ceramic is the dielectric with a co-fired tungsten conductor. Accordingly, for a matching impedance of 50 ohms, the signal and signal complement traces 200, 201 are separated from each other a distance of 300 microns and the dielectric coupling layer 202 is 300 microns thick. The signal and signal complement traces are each 80 microns wide and both are spaced from their respective conductive reference planes 204 and 206 a distance of 500 microns. It is also appropriate to use a glass ceramic package with copper conductors. As one of ordinary skill in the art with benefit of the present teachings appreciates, such an alternative package has differing trace geometries and spacings as dictated by the specific dielectric constant of glass ceramic and resistivity of copper.

Figure 3:
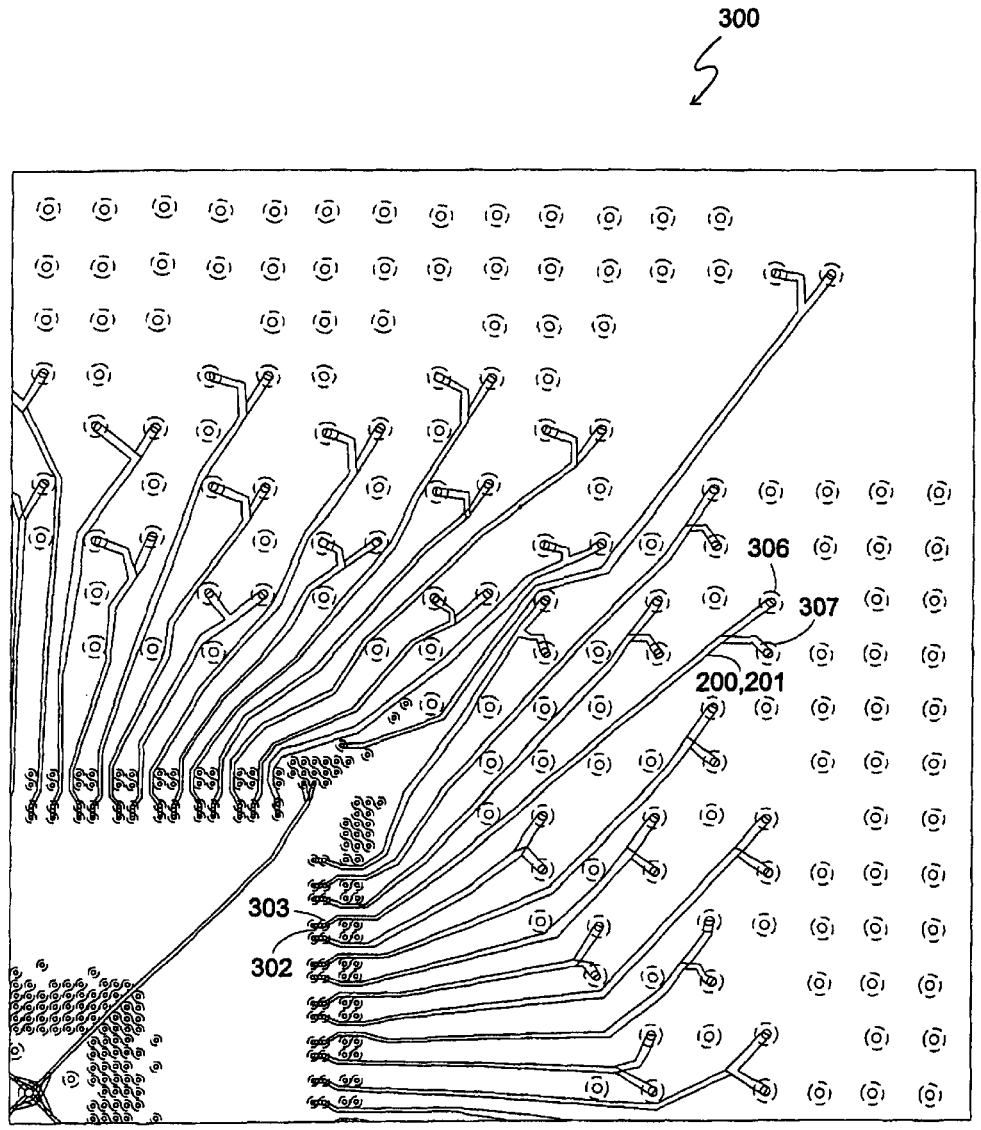
FIG. 3 is a plan view representation of an IC package according to the teachings of the present invention and utilizing signal and signal complement traces on internal layers of the IC package as shown in FIG. 2.

With specific reference to FIG. 3 of the drawings, there is shown a plan view of a corner of an IC package 300 according to the teachings of the present invention in which the signal and signal complement bumps 102, 103 on the IC die 100 have corresponding signal and signal complement flip-chip pads 302, 303 to which the signal and the signal complement bumps meet when the IC die 100 is connected to the IC package 300. Each signal and signal complement flip-chip pad 302, 303 communicates with a signal and signal complement via (not shown in FIG. 3). The signal via is a blind via that extends through the package to electrically connect to the signal trace 200. The signal complement via, also a blind via, extends through the package to electrically connect to the signal complement trace 201. The signal and signal complement traces 200, 201 traverse the IC package 300 substantially parallel to each other. The plan view of FIG. 3 illustrates what appears to be a single trace on a surface of the IC package 300, but what is actually two parallel traces aligned with each other and positioned on different internal layers of the IC package 300 with electrical access through adjacent vias.

Figure 4:
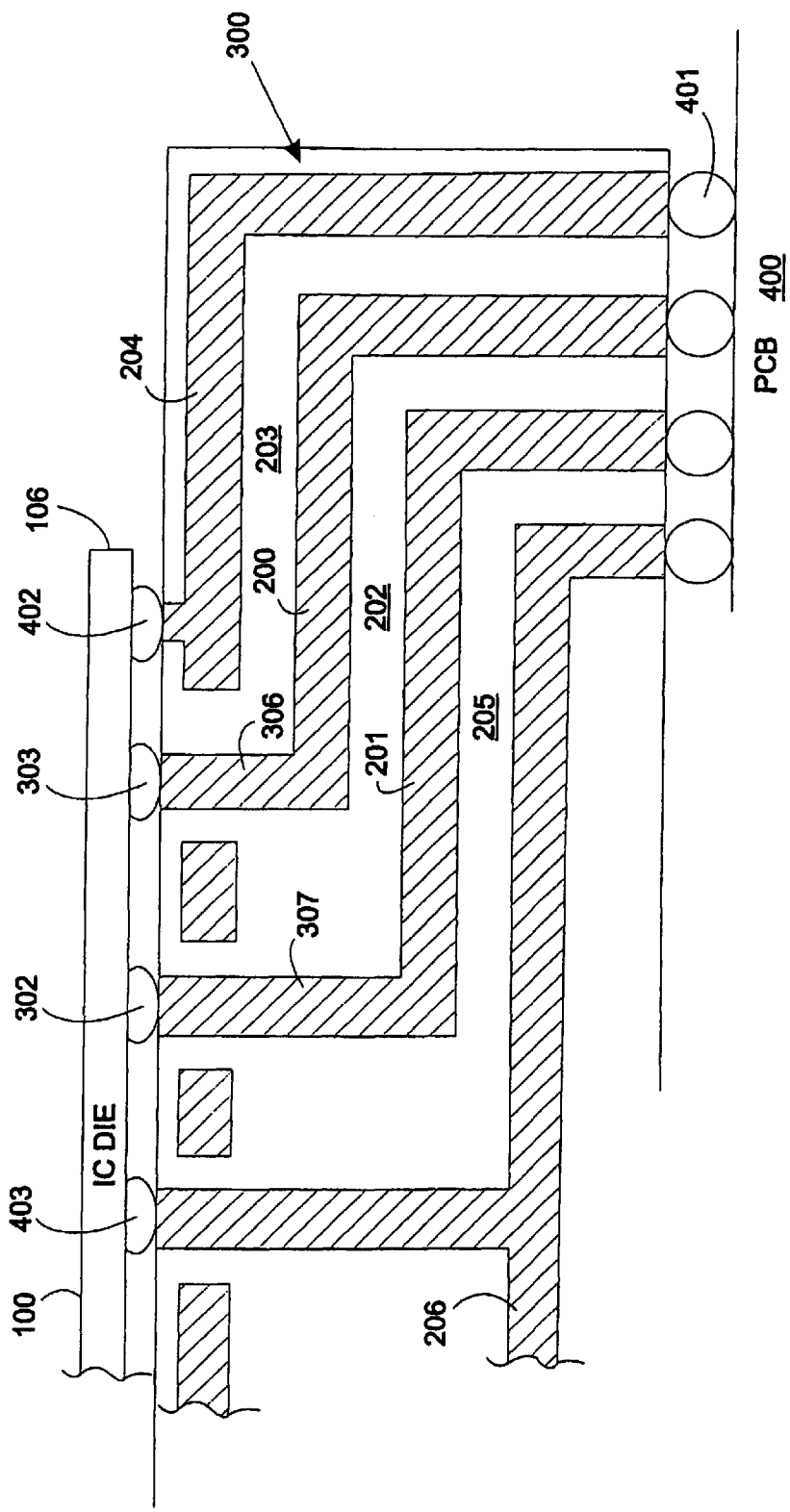
FIG. 4 is a cross sectional representation in a plane parallel to signal and signal complement traces of an IC die and IC package according to the teachings of the present invention.

With specific reference to FIG. 4 of the drawings, there is shown a cross sectional representation of the signal and signal trace 200, 201 routing according to the teachings of the present invention. The signal trace 200 electrically connects with a signal package via 306 and the signal complement trace 201 electrically connects with a signal complement package via 307. The signal and signal complement package vias 306, 307 are adjacent each other so that a maximum of the signal and signal complement trace 200, 201 lengths are parallel. Each signal and signal complement package via 306, 307 connects to an interconnection ball 401 or column or other conventional electrical connection vehicle for an IC package to a PCB 400. As one of ordinary skill in the art appreciates, the broadside coupled trace configuration significantly reduces the routing congestion in an IC package 300 as compared with the conventional edge-side coupled configuration. In a further feature according to the teachings of the present invention and with specific reference to FIG. 4 of the drawings, a reference potential bump 402 and a bias potential bump 403 electrically connect to signal trace conductive reference plane 204 and signal complement trace conductive reference plane 206. Each of the conductive reference planes 204, 206 are connected to either reference potential (GND) or bias potential (Vdd). The conductive reference plane that is connected to bias potential is also connected to reference potential through by-pass capacitors as is conventional in the art. The value of the DC potential, either reference potential or bias potential, that is assigned to the conductive reference planes 204, 206, therefore, is not particularly important from a high frequency signal point of view. The continuous electrical connection between the IC die 100, through the IC package 300, and to the PCB 400 provides the benefit of electrical isolation and maintains a balanced transmission line from IC die 100 to the PCB 400 and controls the value of the matching impedance throughout the connection.

Figure 5:
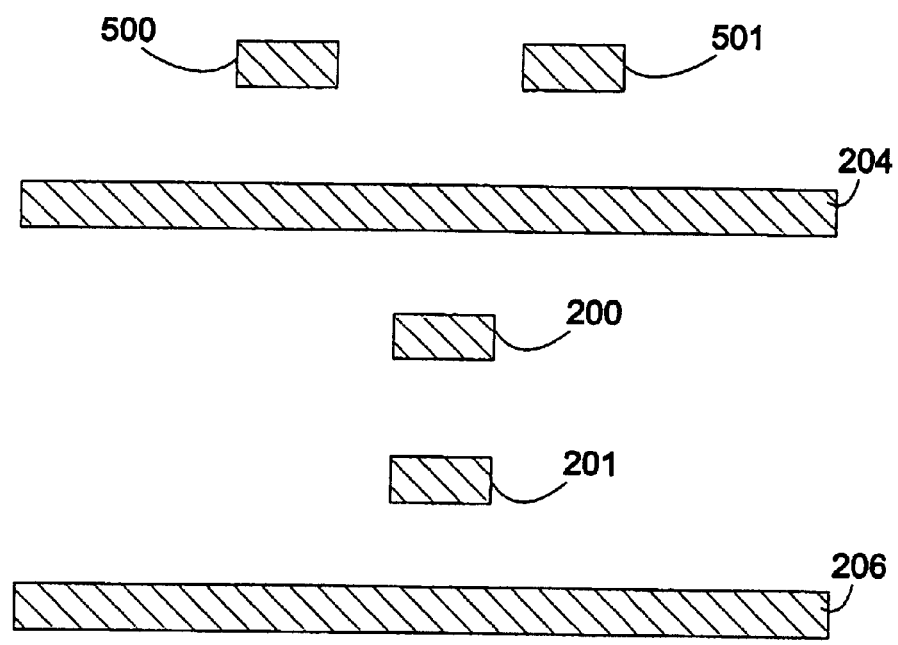
FIG. 5 is a cross sectional representation of broadside coupled traces stacked together with edge-side coupled traces in an IC package according to another aspect of the teachings of the present invention.

With specific reference to FIG. 5 of the drawings, there is shown a cross sectional representation of the broadside coupled signal trace 200 and signal complement trace 201 having similar constituent parts as shown in FIG. 2 of the drawings. An edge-side coupled second signal trace 500 and second signal complement trace 501 pair may be stacked atop the broadside coupled configuration to achieve an alternate embodiment of the present invention. In an alumina ceramic package, the edge-side coupled signal trace 500 and edge-side coupled signal complement trace 501 are co-planar and parallel and are separated from each other a distance of 300 microns. Advantageously, the edge-side coupled configuration can share the signal trace conductive reference plane 204 with the broadside coupled trace configuration upon which it is disposed. In such a package, the signal trace and signal trace complement interconnection flip-chip pads and vias 302, 303 may be positioned on an internal portion of the IC area while the interconnection pads for the edge-side coupled traces 500, 501 are disposed on a perimeter of the IC die 100. Advantageously, more of the available IC surface area may be utilized as compared to the prior art thereby reducing the overall cost of the IC die.

Figure 6:
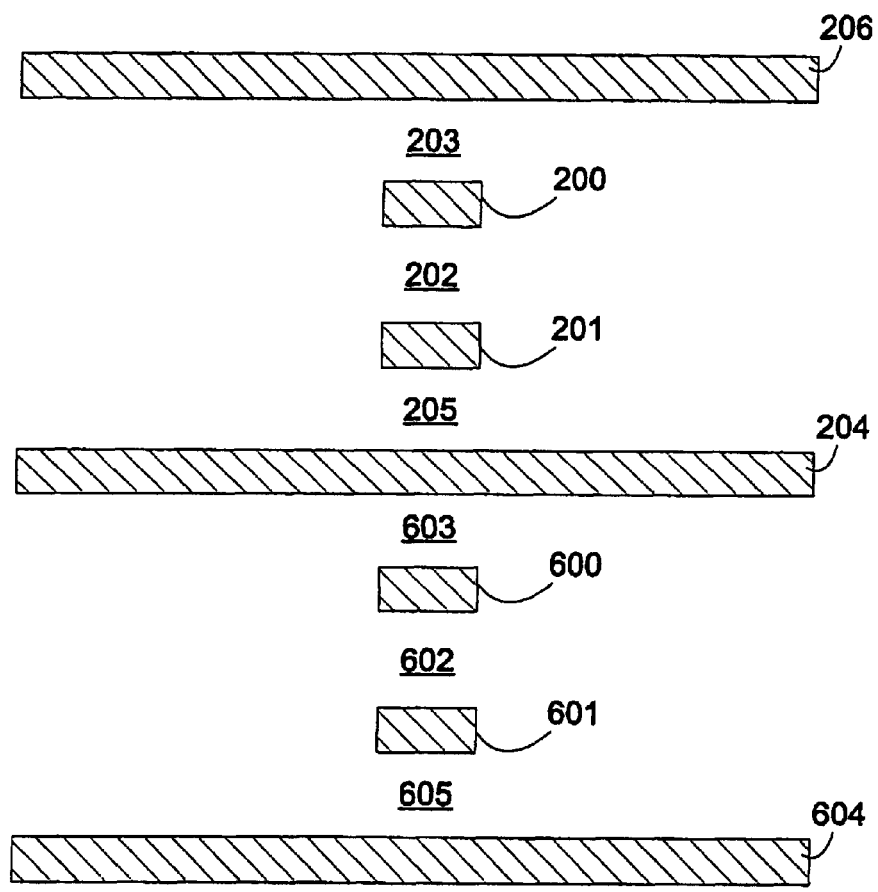
FIG. 6 is a cross sectional representation of a dual stack embodiment of broadside coupled traces in an IC package and packaged IC according to another aspect of the teachings of the present invention.

With specific reference to FIG. 6 of the drawings, there is shown a dual stack embodiment according to the teachings of the present invention in which two broadside coupled traces may be stacked vertically sharing a conductive reference plane either 204 or 206. The signal trace and signal complement trace 200, 201 in this embodiment comprise a first signal trace 200 and first signal complement trace 201. The embodiment further comprises second signal trace 600 and second signal complement trace 601. The second signal and signal complement traces 600, 601 are separated from each other by a second dielectric coupling layer 602. The first signal trace conductive reference layer 204 may be shared with the second signal trace 600, so that a single conductive layer provides for a balanced transmission line for two sets of signal/signal complement trace pairs. The second signal trace 600 need not share a conductive layer and may have a separate conductive reference plane if it is appropriate for other purposes in the IC package design.

Alternatively, multiple conductive reference planes may exist between first signal trace/signal complement trace/dielectric layers 200, 201, 202, 203, 205 and second signal trace/signal complement trace/dielectric layers 600, 601, 602, 603, 605 without adversely affecting signal transmission characteristics. There is also a second signal trace complement conductive reference plane 604 separated from said second signal complement trace 601 by a 300 micron thick signal trace dielectric isolation layer 605. Similarly, the second signal trace 600 is separated from the first signal trace conductive reference plane 204 by a second signal trace dielectric isolation layer 603. A dual stack configuration as shown uses the IC die 100 and IC package 300 vertical dimension to reduce horizontal routing congestion. Three or more similar signal trace and signal complement trace layers with interstitial dielectric layers and conductive reference planes may be implemented in an IC package 400 according to the teachings of the present invention to achieve increased relief from routing congestion while maintaining balanced transmission line characteristics at the matching impedance.

Figure 7:
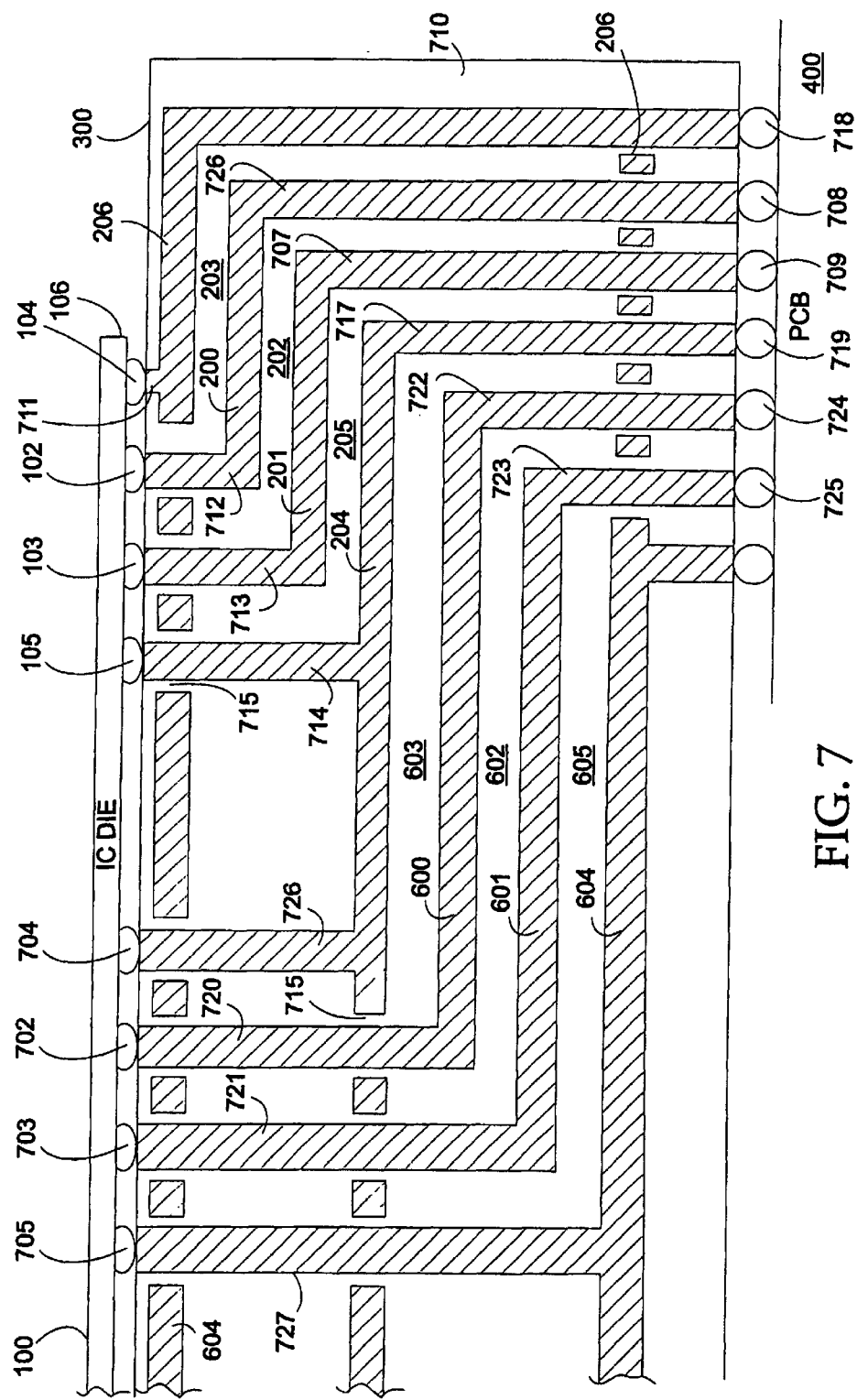
FIG. 7 is a cross sectional representation in a plane perpendicular to the plane shown in FIG. 6 of the dual stack broadside coupled traces in an IC package and packaged IC according to the teachings of the present invention.

With specific reference to FIG. 7 of the drawings, there is shown a cross sectional representation of the IC die 100, the bump unit 101 and the IC package 300 having the dual stack broadside coupled trace configuration shown in FIG. 6. In FIG. 7, the bumps 102–105 in the bump unit 101 are positioned along a line that is perpendicular to the IC die edge 106. A first bump unit 101 is shown adjacent the die edge 106 with bumps 702–705 of a second bump unit aligned along the same parallel line as the first bump unit 102–105 and on a side of the first bump unit opposite the IC die edge 106. The second bump unit 702–705 may be positioned away from the IC die edge 106 without requiring an increase in the horizontal spacing of the bump units because of the dual stack broadside coupled configuration. This permits efficient use of the IC die 100 perimeter to maximize the number of channels that fit within the available space.

In the embodiment shown in FIG. 7, the first signal bump 102 and first signal complement bump 103 are electrically connected through first signal and first signal complement vias 712, 713. The first signal and signal complement vias 712, 713 are blind vias and provide vertical access to internal conductive layers. The first signal and signal complement vias 712, 713 electrically connect to the first signal trace 200 and first signal complement trace 201, respectively. The first signal and first signal complement traces 200, 201 traverse different inner layers of the IC package 300 remaining substantially parallel to each other for most of the length that they traverse. Each first signal and signal complement trace 200, 201 connects to respective first destination via 706 and first destination complement via 707, also blind vias, that electrically connect with balls 708, 709 of the IC package 300. The balls 708, 709 may be balls of a conventional ball grid array package or may be columns or lands common to other styles of IC packaging having conventional interconnection plans to the PCB 400. FIG. 7 shows that the balls 708, 709 are aligned with the bumps 102, 103 of the IC die 100. While the alignment shown is desirable because it maintains the consistently parallel path of the signal and signal complement trace 200, 201 while providing a consistently spaced conductive reference plane along the entire length, this depiction is primarily for purposes of clarity. Other IC package design considerations may dictate the location of an exit point of any one signal or signal/signal complement pair. It is also acceptable for one or both of the first signal and first signal complement traces 200, 201 to make a horizontal bend or jog so that the first destination and destination complement vias 708, 709 are horizontally aligned along the IC package edge 710 or are not aligned at all. Such as "jog" is illustrated in FIG. 3 of the drawings. A designer is at liberty to make alternative provisions because a substantial portion of the length of the signal and signal complement trace pair relative positioning is parallel and is consistently spaced from respective conductive reference planes 206, 204.

The remaining two bumps 105, 104 in the bump unit 101 are electrically connected to reference potential (GND) and bias potential (Vdd), respectively. The reference potential bump 105 is electrically connected through first reference potential bump via 714. The bias potential bump 104 is electrically connected through first bias potential bump via 711. The reference potential bump via 714 electrically connects to first signal complement trace conductive reference plane 204. This connection makes the first signal trace conductive reference plane 204 a conventional "ground plane" known to those in the art. As shown in FIG. 7, the ground plane extends throughout the package layer except for insulating rings 715 disposed around the vias not intended for connection to the ground plane 204 in the example. The first bias potential bump via 711 electrically connects to first signal trace conductive reference plane 206. This connection makes the first signal trace conductive reference plane 206 a conventional "power plane" known to those in the art. As shown in FIG. 7, the power plane extends throughout the package layer except for certain ones of the insulating rings 715 disposed around the vias not intended for connection to the power plane 206. The ground and power planes are similarly connected through ground and power destination vias 716, 717 to ground and power IC package balls 718, 719, respectively.

Figure 8:
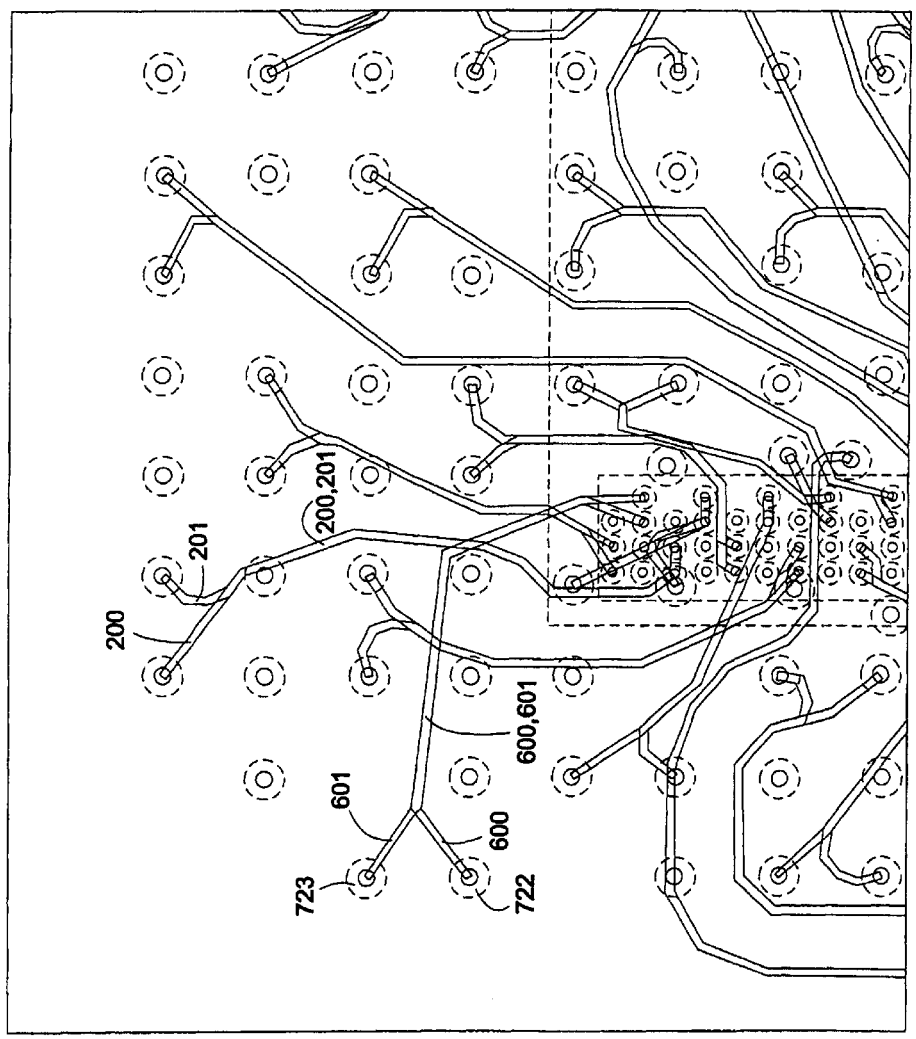
FIG. 8 is a plan view representation of traces in an IC package that is appropriate for a dual stack broadside coupled signal and signal complement trace configuration according to an aspect of the teachings of the present invention.

In the dual stack broadside coupled trace configuration, the first signal complement trace conductive reference plane 204, the ground plane is this example, is a shared conductive reference plane with the second signal trace 600. The second signal bump 702 and second signal complement bump 703 are electrically connected through second signal and second signal complement vias 720, 721. The second signal and signal complement vias 720, 721 are blind vias and provide vertical access to internal conductive layers that are closer to the IC package 300 than the layers carrying the first signal and signal complement traces 200, 201. The second signal and signal complement vias 720, 721 electrically connect to the second signal trace 600 and -second signal complement trace 601, respectively. The second signal and signal complement traces 600, 601 traverse different inner layers of the IC package 300 remaining substantially parallel to each other for most of the length that they traverse. While it is possible that the first signal and signal complement traces 200, 201 be parallel to the second signal and signal complement traces 600, 601, as illustrated in FIG. 7 of the drawings, it is not necessary, is used in the drawing primarily for clarity, and is not considered an IC package design constraint. A more practical result is shown in FIG. 8 of the drawings, where what appears to be intersecting first and second signal and signal complement traces 200, 201 and 600, 601, is in reality first and second broadside coupled traces on electrically distinct IC package layers. For purposes of clarity, only the signal and signal traces are represented. Referring back to FIG. 7 of the drawings, each second signal and signal complement trace 600, 601 connects to respective second destination via 722 and second destination complement via 723, also blind vias, that electrically connect with balls 724, 725 of the IC package 300.

The remaining two bumps 705, 704 in the second bump unit are electrically connected to reference potential (GND) and bias potential (Vdd), respectively. The reference potential bump 704 is electrically connected through second reference potential bump via 726 to first signal complement conductive reference plane 204, which is the ground plane in the example. The bias potential bump 705 is electrically connected through second bias potential bump via 727 to the second signal complement conductive reference plane 604. This connection makes the second signal complement trace conductive reference plane 604 another conventional "power plane" in the illustrative example. Advantageously, proper placement and spacing of the ground and power planes provide for balanced transmission of broadside coupled signal trace pairs over multiple IC package layers. Additionally, the vertical stacking arrangement provides for a denser IC package grid permitting more channels to fit in a smaller amount of PCB surface area.

Figure 9:
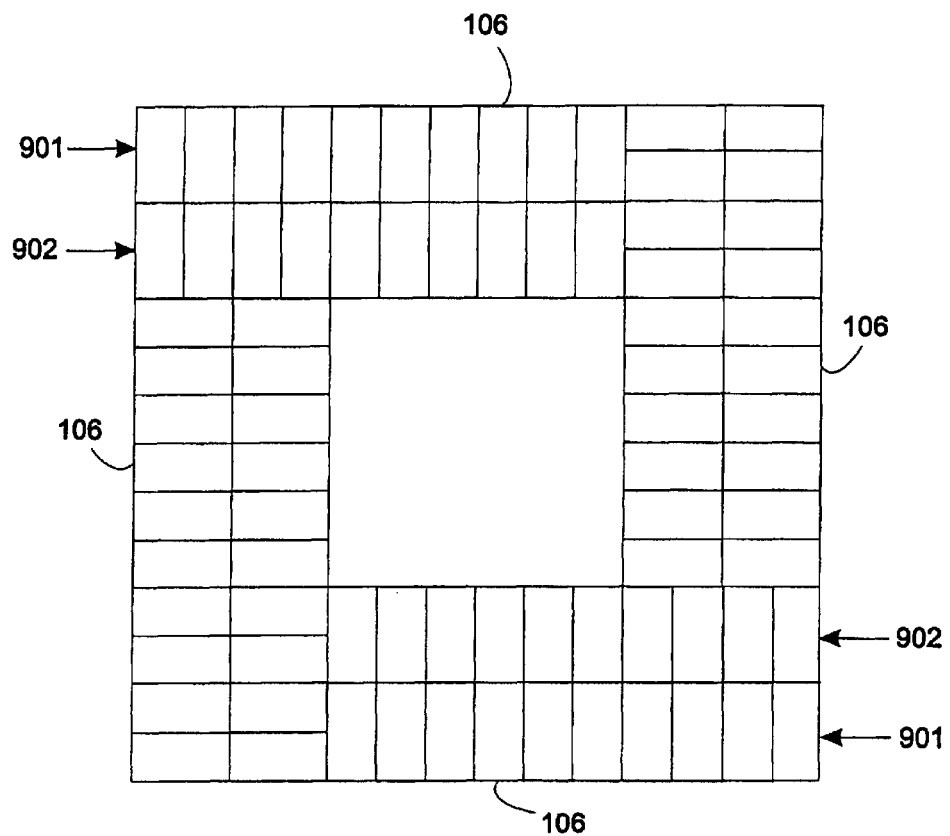
FIG. 9 is a plan view representation of an IC package showing interconnection bump unit sets for a dual stack IC die configuration according to another aspect of the present invention.

With specific reference to FIG. 9 of the drawings, there is shown an illustrative representation of an appropriate layout for interconnection bumps of an IC die 100 according to another aspect of the teachings of the present invention and implementing dual stack broadside coupled traces in which first and second bump unit rows 901, 902 are on a perimeter of the IC die 100. The bumps in the bump unit rows 901, 902 are aligned along parallel lines that are perpendicular to the IC die edge 106. Each bump unit in the first and second bump unit rows 901, 902 are aligned one after the other in a horizontal direction and along a same line with each other in a dual stack embodiment. The broadside signal and signal complement trace configuration removes the design constraint that all bumps be accessible from horizontal traces traversing a single IC package layer. The bump layout shown in FIG. 9 of the drawings makes use of more surface area than is possible under the prior art, but not all of the central portion of the IC die 101.

Figure 10:
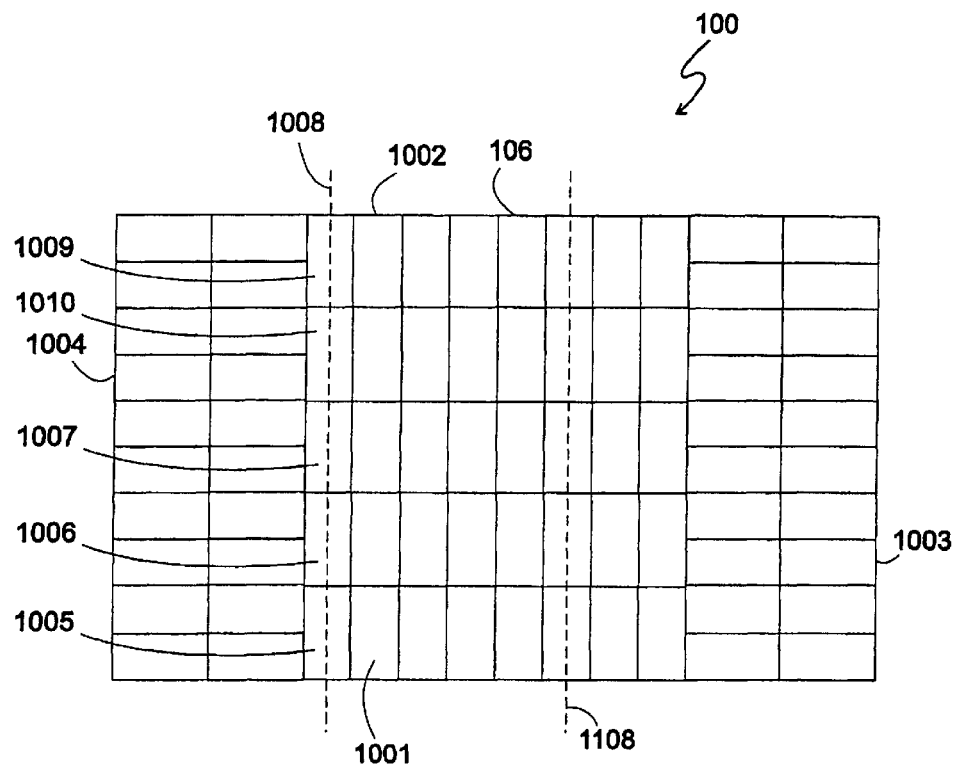
FIG. 10 is a plan view representation of an IC package showing another layout of interconnection bump unit sets for another embodiment of an IC die according to another aspect of the teachings of the present invention.

With specific reference to FIG. 10 of the drawings, there is shown another illustrative representation of another appropriate bump layout according to another aspect of the teachings of the present invention in which three bump unit rows populate a first edge 1001 of the IC die 100, two bump unit rows populate an opposite second edge 1002 of the IC die 100, and a single stack populates the remaining third and fourth edges 1003, 1004 of the IC die 100. On the first edge 1001, first bump unit 1005, second bump unit 1006, and third bump unit 1007 are all similarly aligned along first parallel line 1008 perpendicular to the first die edge 1001. It is possible to place adjacent sets of first, second and third bump units very close together because access to signal traces is in a vertical direction in the IC package 300. Fourth and fifth bump units 1009, 1010 in the dual bump unit row configuration on the second edge 1002 of the IC die 100 may be, but need not be, aligned along the same first parallel line 1008.

Figure 11:
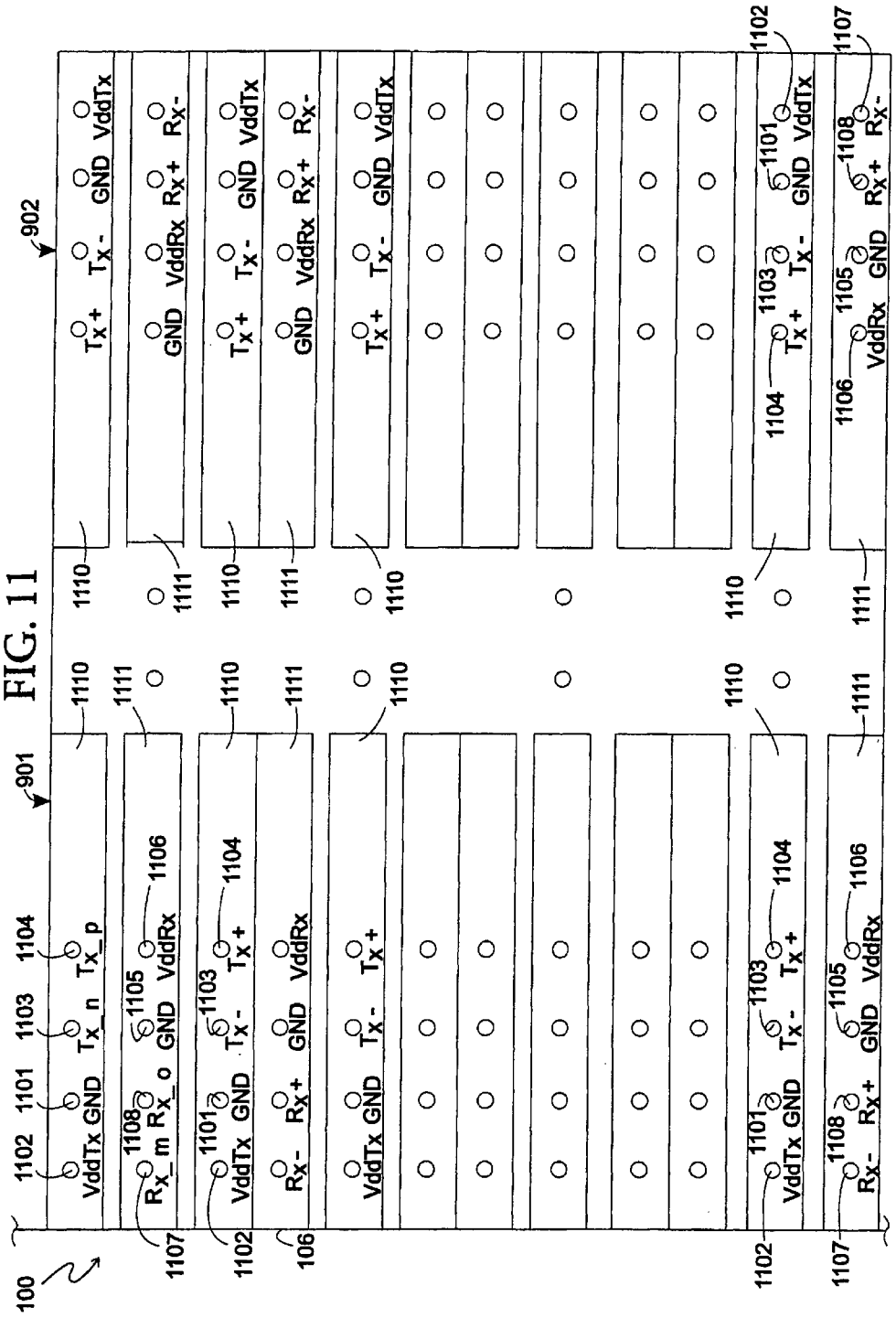
FIG. 11 is an expanded plan view of the IC package show in FIG. 9 illustrating a bump designation plan according to another aspect of the teachings of the present invention.

With specific reference to FIG. 11 of the drawings, there is shown an enlarged view of a dual row bump unit configuration on an IC die 100 that is appropriate for use with a dual stack broadside coupled trace configuration. In the example, the IC die bumps are assigned voltage potentials according to another aspect of the present invention. In a Serdes design as well as many other IC designs, transmission channels carry strong signals relative to the signal strength of the receive channels in the vicinity of the IC die 100 and IC package 300. To maximize signal quality, therefore, it is beneficial to isolate transmission channels as much as possible from receive channels by placing additional space between them. In single bump unit row or multiple bump unit row IC die embodiment, there is a plurality of transmission bump units 1110 and a plurality of receive bump units 1111. FIG. 11 illustrates the transmission and receive bump units 1110, 1111 having a similar bump unit alignment as discussed and shown in FIG. 9. The teachings also apply equally as well to other IC die configurations such as the one shown in FIG. 10. In the example of FIG. 11, the IC die 100 contains an equal plurality of transmission and receive channels and accordingly, of transmission and receive bump units 1110, 1111. In the example of FIG. 11, therefore, it is beneficial to alternate transmission and receive bump units 1110, 1111 along the perimeter of the IC die. The receive channel signal and signal complement bumps 1107, 1108 are assigned to bumps closest to the IC die edge 106. The receive channel reference potential and bias potential bumps, 1105, 1106, respectively, are assigned to the remaining two bumps in the receive channel bump unit 1111 with the receive channel reference potential bump 1105 being disposed closest to the receive channel signal and signal complement bumps 1107, 1108. The transmission channel signal and signal complement bumps 1103, 1104 are assigned to bumps away from the IC die edge 106. The transmission channel reference potential and bias potential bumps, 1102, 1101, respectively, are assigned to the remaining two bumps in the transmission channel bump unit 1110 with the transmission channel reference potential bump 1101 being disposed closest to the transmission channel signal and signal complement bumps 1103, 1104. In an alternating transmission channel/ receive channel configuration, adjacent transmission signal and signal complement bumps 1103, 1104 and receive signal and signal complement bumps 1107, 1108 are horizontally separated from each other and are positioned diagonally relative to each other at the IC die surface. Additionally, adjacent transmission signal and signal complement bumps 1103, 1104 in different transmission channel bump units 1110 are separated in space by a thickness of the receive channel bump unit 1111. Similarly, adjacent receive signal and signal complement bumps 1107, 1108 in different receive channel bump units 1111 are separated in space by a thickness of the receive channel bump unit 1111. The IC die 100 embodiment shown in FIG. 11 is appropriate for a dual stack broadside coupling trace IC package and has a second bank of transmission and receive channel bump units 1110, 1111 positioned towards a center of the IC die 100 and away from the IC die edge 106. Also in FIG. 11, the first stack and second stack of bump units are aligned along parallel lines perpendicular to the IC die edge 106. Consistent with the same teachings of this paragraph, bump units that are aligned along the same parallel line are mirror images of each other. Advantageously, in the bump layout for this embodiment the receive channel signal and signal complement bumps 1107, 1108 achieve the maximum possible isolation from the transmission channel signal and signal complement bumps 1103, 1004. As one of ordinary skill in the art appreciates, application of the basic teachings regarding bump layout and the design objective to maximize the isolation of the receive channel signal and signal complement bumps 1107, 1108 from other known noise sources results in a number of possible embodiments that is difficult to quantify. Alternatives are also based upon the number and characteristics of the channels that populate the IC die 100. Alternate embodiments, therefore are within the scope of one of ordinary skill in the art given the benefit of the teachings herein.

Figure 12:
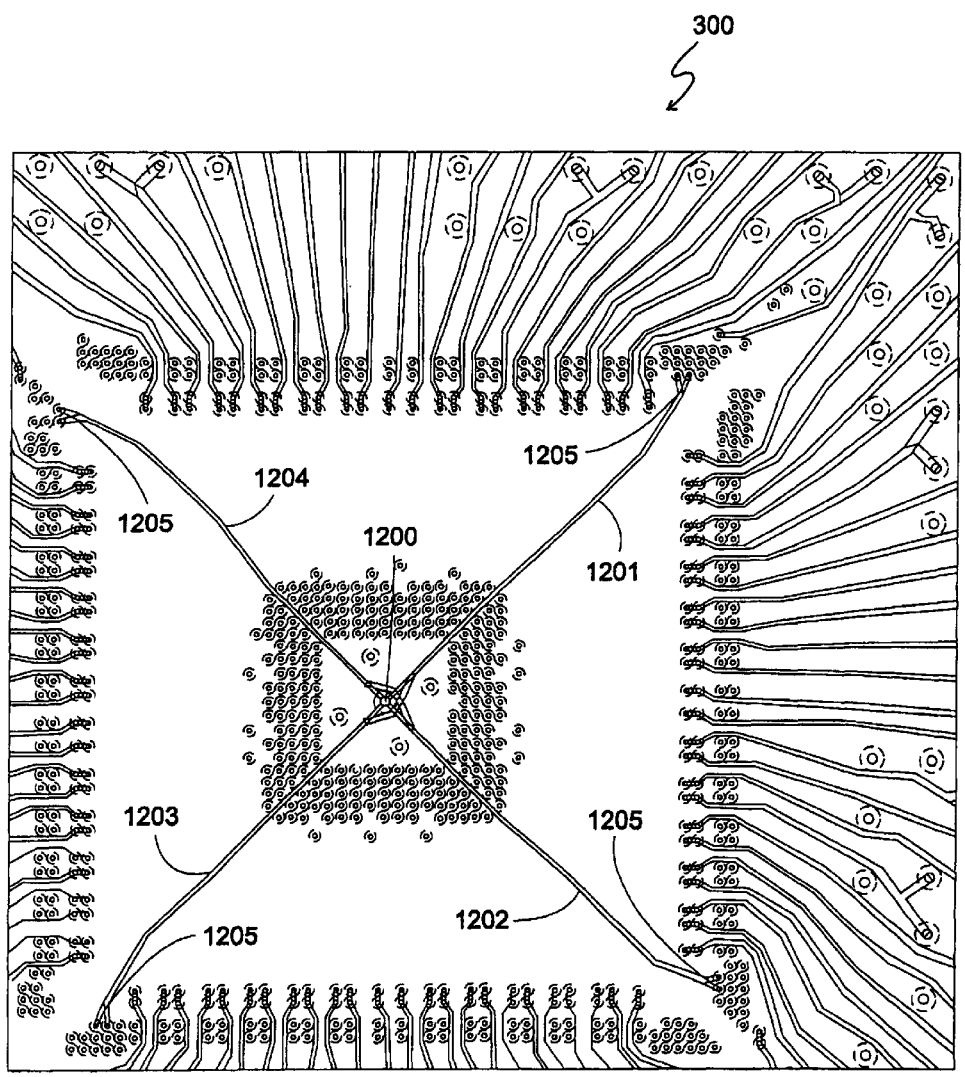
FIG. 12 is a plan view representation of an IC package showing a clock signal distribution plan according to another aspect of the teachings of the present invention.
Figure 13:
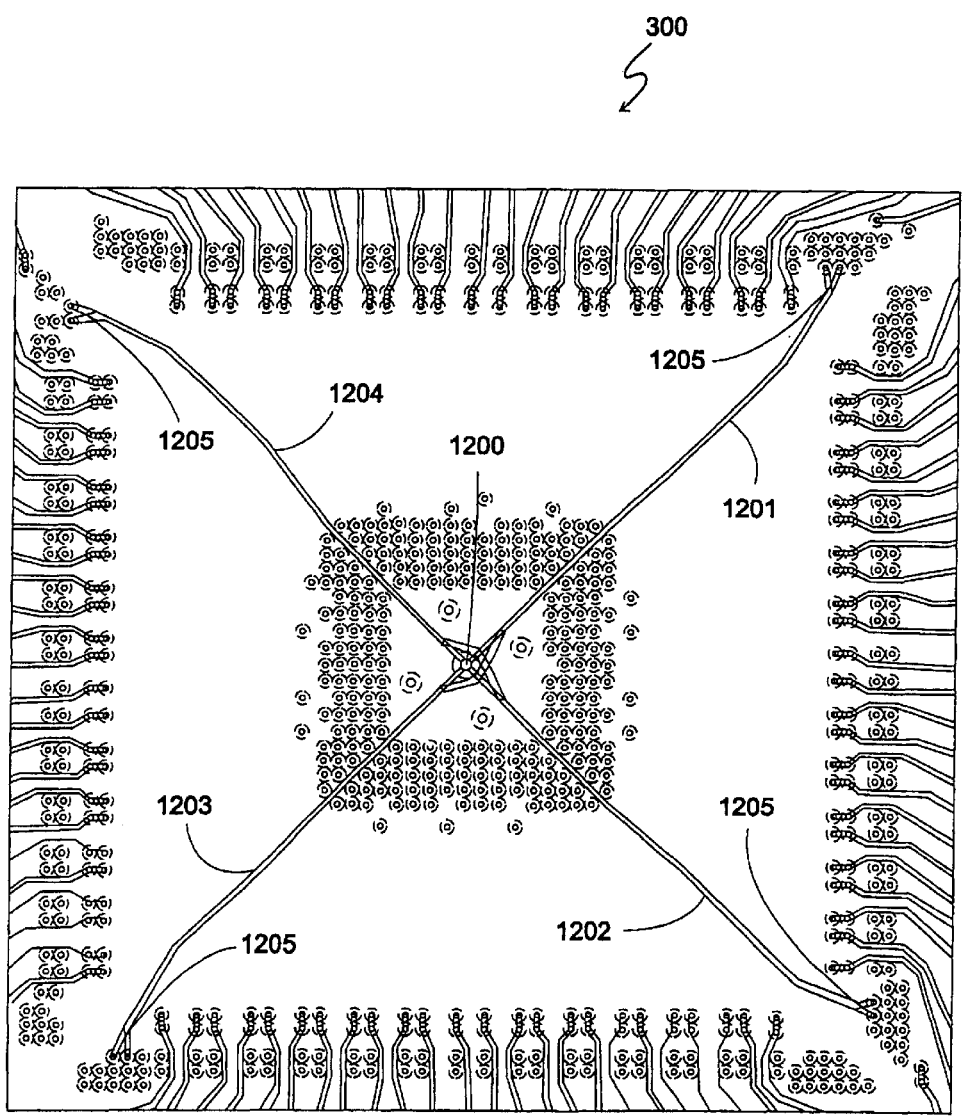
FIG. 13 is a plan view presentation of the clock signal distribution plan of FIG. 12 presented with an alternative scale.

With specific reference to FIG. 12 of the drawings, there is shown an IC package 300 having a clock signal access 1200 in a center of the IC package 300. First, second, third, and fourth clock distribution signal and signal complement pairs 1201, 1202, 1203, and 1204 distribute the clock signal from the clock signal access on the PCB to four positions on the IC die. The traces shown in the drawing represent two different layers, the signal and signal complement trace layers, of the IC package 300. Advantageously, the use of broadside coupled traces in an IC package 300 permits low noise distribution of the clock signal through the IC package 300 while maintaining consistent trace length for the first through fourth clock distribution signal and signal complement traces 1201 through 1204. Each of the first through fourth clock distribution signal and signal complement traces 1201–1204 electrically connect to clock distribution vias 1205 and then to the interconnection bumps on the IC die. Features of the invention have been described herein by way of example and with reference to the accompanying drawings. Alternatives to the examples will occur to one or ordinary skill in the art given benefit of the teachings herein, and such alternatives remain within the scope of the appended claims. Many alternatives will result from different IC die 100 designs and other practical constraints. One or more layers using broadside coupled traces either alone or in conjunction with edge-side coupled traces are possible alternatives. A dielectric material other than alumina ceramic and glass ceramic is possible, alumina ceramic being used as a specific example for its current perceived benefits of cost and manufacturability.

What is claimed is:

1. A packaged IC comprising:
    an IC die,
    a signal trace and a signal complement trace positioned relative to each other to maximize broadside coupling for a matching impedance, said signal and signal complement traces separated by a dielectric coupling layer, and electrically connected to pads on said IC die,
    a signal trace conductive reference layer separated from said signal trace by signal trace dielectric isolation layer, and
    a signal complement trace conductive reference layer separated from said signal complement trace by signal complement trace dielectric isolation layer.

2. A packaged IC as recited in claim 1 wherein said dielectric coupling layer and said signal and signal complement trace dielectric isolation layers are ceramic.

3. A packaged IC as recited in claim 1 wherein said matching impedance has a value of approximately 50 ohms.

4. A packaged IC as recited in claim 3 wherein said dielectric coupling layer and said signal and signal complement trace dielectric isolation layers are ceramic, said signal and said signal complement traces have a width of approximately 80 microns, said signal and signal complement traces are separated from each other a distance of approximately 300 micrometers, and said signal and signal complement dielectric isolation layers are separated from said signal and signal complement traces by approximately 300 microns.

5. A packaged IC as recited in claim 1 wherein said signal trace and said signal complement trace are substantially parallel with each other.

6. A packaged IC as recited in claim 1 and further comprising via pairs wherein said via pairs are connected to said signal trace and said signal complement trace and are adjacent each other.

7. A packaged IC as recited in claim 6 wherein said via pairs are adjacent to a first via electrically connected to said signal trace conductive reference layer and a second via electrically connected to said signal complement trace conductive reference layer.

8. A packaged IC as recited in claim 1 wherein said signal and signal complement traces electrically connect to a clock signal on said IC die.

9. A packaged IC as recited in claim 8 wherein access to said clock signal is in a center of said IC package.

10. A packaged IC as recited in claim 8 wherein a plurality of signal and signal complement traces deliver said clock signal from an access to said clock signal on said IC die to a plurality of locations on said packaged IC, each of said plurality of signal and signal complement traces having substantially equivalent trace lengths.

11. A packaged IC as recited in claim 3 disposed on a circuit board, said circuit board having 50 ohm circuit board traces wherein leads on said IC package that are electrically connected to said signal and signal complement traces are connected to said 50 ohm circuit board traces.

12. A packaged IC as recited in claim 1 wherein said signal trace comprises a first signal trace and said signal complement trace comprises a first signal complement trace and further comprising second signal and second signal complement traces positioned to maximize edge-side coupling and separated from said signal trace conductive reference layer by a second dielectric isolation layer.

13. A packaged IC as recited in claim 1 wherein said signal trace comprises a first signal trace and said signal complement trace comprises a first signal complement trace and further comprising second signal and second signal complement traces separated by a second dielectric coupling layer, said second signal and signal complement traces positioned relative each other to maximize broadside coupling wherein said first electrically conductive reference layer is positioned intermediate said first signal and signal complement traces and said second signal and signal complement traces and is separated from said second signal trace by a second signal trace dielectric isolation layer and further comprising a second signal complement trace conductive reference layer positioned on an opposite side of said second signal and signal complement traces separated from said second signal complement trace by a second signal complement trace dielectric isolation layer.

14. A packaged IC as recited in claim 13 and further comprising any number of additional signal and signal complement traces, each separated by a dielectric coupling layer and positioned to maximize broadside coupling, said additional signal and signal complement traces sharing a signal trace conductive reference layer with another signal and signal complement trace pair on at least one side and having corresponding signal trace and signal complement trace dielectric layers separating said signal and signal complement traces from said signal and signal complement trace conductive reference layers.

15. An IC die comprising:
a plurality of first signal and signal complement die pads comprising a die pad pair, each first signal and signal complement die pad pair aligned along parallel lines that are perpendicular to a die edge, said plurality of first signal and signal complement pads being adjacent said die edge,
a plurality of second signal and signal complement die pads aligned along said parallel lines that are perpendicular to said die edge, said plurality of second signal and signal complement die pads being on an opposite side of said plurality of first signal and signal complement pads from said die edge.

16. An IC die as recited in claim 15 and further comprising any number of additional pluralities of signal and signal complement die pads, each signal and signal complement die pad pair aligned along said parallel lines.

17. An IC die as recited in claim 15 wherein each said signal and signal complement die pad pair further comprises a reference and bias pad aligned along said parallel lines.

18. An IC die as recited in claim 17 wherein said signal, signal complement, reference, and bias pads comprise a single signal pad unit and wherein each signal pad unit is either a receive signal pad unit or a transmit signal pad unit and wherein said reference and bias pads of a receive signal pad unit are closest to said signal and signal complement pads of an adjacent parallel one of said transmit pad units.

19. An IC die as recited in claim 17 wherein said signal, signal complement, reference, and bias pads comprise a single signal pad unit and wherein each signal pad unit is either a receive signal pad unit or a transmit signal pad unit and wherein said transmit signal and signal complement pads are positioned as far away as possible from said receive signal and signal complement pads.

* * * * *